United States Patent

Ohsawa et al.

[11] 4,059,802
[45] Nov. 22, 1977

[54] INPUT LEVEL DISPLAY CIRCUIT FOR RECEIVERS

[75] Inventors: Mitsuo Ohsawa, Fujisawa; Wataru Yamatani, Hatogaya; Yukio Onoe, Tokyo, all of Japan

[73] Assignee: Sony Corporation, Tokyo, Japan

[21] Appl. No.: 671,968

[22] Filed: Mar. 30, 1976

[30] Foreign Application Priority Data

Apr. 2, 1975 Japan .................................. 50-40702
Apr. 2, 1975 Japan .................................. 50-40703

[51] Int. Cl.² ............................................. H04B 1/16
[52] U.S. Cl. .................................... 325/398; 325/364; 325/455
[58] Field of Search ............... 325/398, 364, 455, 363; 340/185, 378 R; 334/30, 31, 32, 33, 34, 35, 36, 37

[56] References Cited

U.S. PATENT DOCUMENTS

| | | | |
|---|---|---|---|
| 3,696,301 | 10/1972 | Hoshi | 325/455 |
| 3,717,817 | 2/1973 | Auerbach | 334/30 |
| 3,748,582 | 7/1973 | Ohsawa | 325/398 |
| 3,869,673 | 3/1975 | Close | 325/455 |
| 3,882,399 | 5/1975 | Darpowycz et al. | 325/455 |
| 3,919,645 | 11/1975 | Ohsawa | 325/363 |

*Primary Examiner*—Benedict V. Safourek
*Assistant Examiner*—Tommy P. Chin
*Attorney, Agent, or Firm*—Hill, Gross, Simpson, Van Santen, Steadman, Chiara & Simpson

[57] ABSTRACT

A receiver has a first input circuit and a first amplifier connected to a first rectifier circuit and has a second input circuit and a second amplifier connected to a second rectifier circuit. The first and second rectifier circuits produce first and second direct current signals, and the first and second rectifier circuits are connected to a meter drive circuit which produces a direct current signal in response to the first or second direct current signal so that the direct current signal from the meter drive circuit actuates a meter to indicate the input level of either the first input circuit or second input circuit.

12 Claims, 2 Drawing Figures

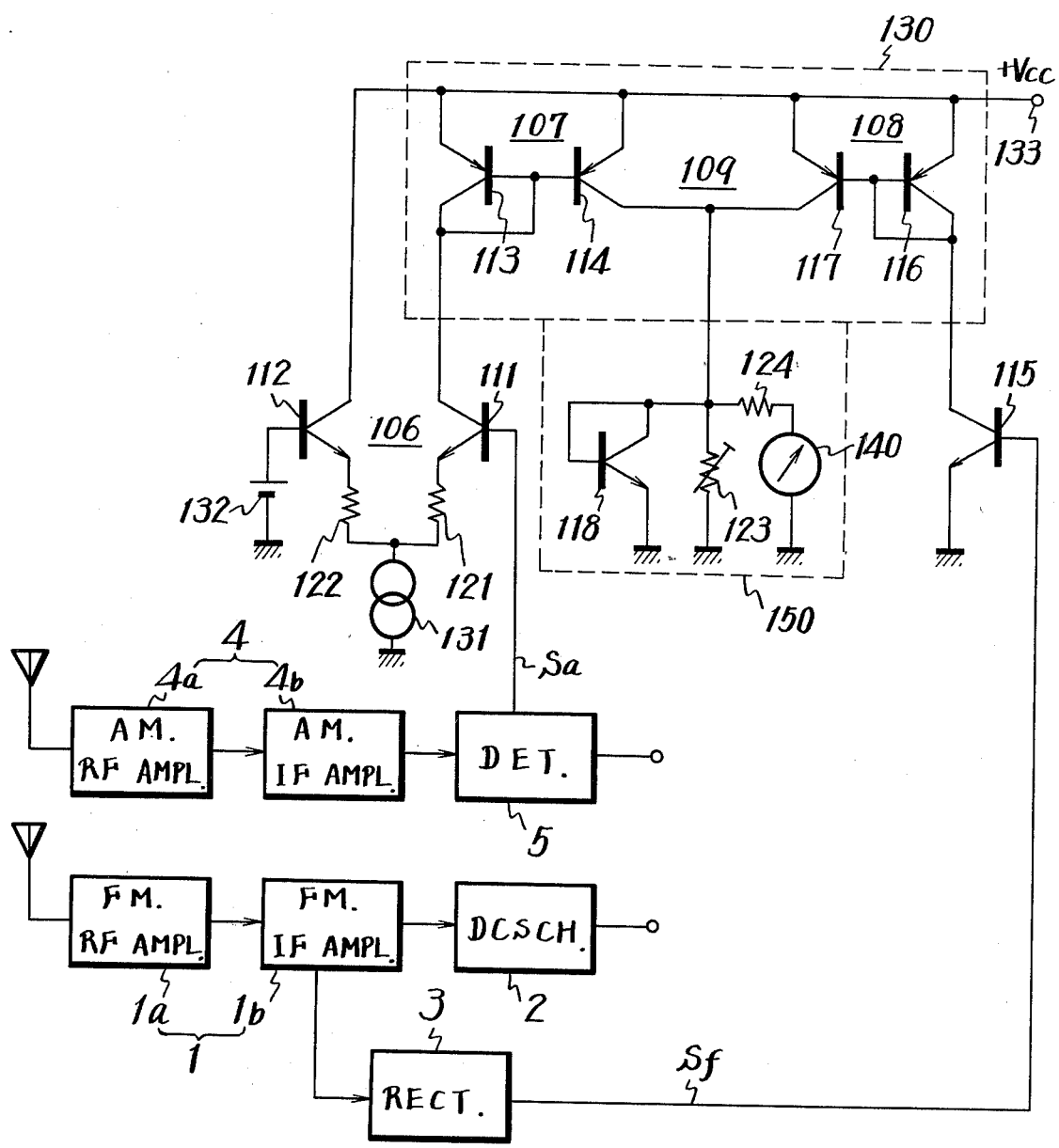

INPUT LEVEL DISPLAY CIRCUIT FOR RECEIVERS

BACKGROUND OF THE INVENTION

1. Field of the Invention:

This invention relates generally to an input level display circuit for receivers, and more particularly to a receiver that has an indicator circuit connected to both first and second input circuits to be energized thereby.

2. Description of the Prior Art:

In an FM-AM tuner, in order to indicate its input level, an FM intermediate frequency signal or AM intermediate frequency signal is rectified, then a direct current signal corresponding to its input level is obtained, and the direct current signal is supplied to a tuner input meter, as in the prior art.

In such a case, a problem arises if an input level indicating device, namely, an input meter, is desired in a receiver suitable for the reception of AM signals as well as FM signals. The indicating device has to be controlled on FM signal reception in a manner different from AM signal reception. It is objectionable to provide an additional switch section on the AM/FM switch intended for switching over the receiver from AM signal reception to FM signal reception for this purpose, on the one hand, because this results in a switch which is more costly and takes up more space and, on the other hand, because it is usually necessary for this purpose to provide long conducting wires in the receivers leading to the switch.

Further, AM/FM receivers at present have stages such as RF, IF, descriminator, or multiplex stages formed as integrated circuits. Due to the employment of an integrated circuit, the receiver can be easily assembled and becomes long in life since the respective parts are solid state. However, as described above, it is not appropriate for a receiver using an integrated circuit to have a switch for indicating signal strength of AM or FM signals on an input level indicating device. An ordinary switch has a mechanical contact and is apt to be damaged and short in life as compared with an electronic switch. This is counter to utilizing the advantages of a receiver made of an integrated circuit.

SUMMARY OF THE INVENTION

It is an object of this invention to provide an input level display circuit for receivers free from the defects inherent in the prior art.

It is another object of the invention to provide an input level display circuit for a receiver which has no mechanical meter switch but can display the levels of first and second input signals on the same meter.

It is a further object of the invention to provide an input level display circuit suitable for use with an AM/FM receiver made of an integrated circuit.

According to an aspect of the invention there is provided an input level display circuit for receivers which comprises first and second input circuits for receiving and amplifying first and second broadcasting signals, respectively. First and second rectifying circuits are connected to the first and second input circuits, respectively, for producing first and second direct current signals. A meter drive circuit is supplied with the first and second direct current signals and produces a third direct current signal in response to either one of the first and second direct current signals. An indicating device is supplied with the third direct current signal and indicates the input level of either the first input circuit or second input circuit.

The other objects, features and advantages of the invention will become apparent from the following description taken in conjunction with the accompanying drawings.

BRIEF DESCRIPTION OF THE DRAWINGS

FIG. 2 is a circuit diagram showing a second embodiment of the invention.

DESCRIPTION OF THE PREFERRED EMBODIMENTS

Figure 1:
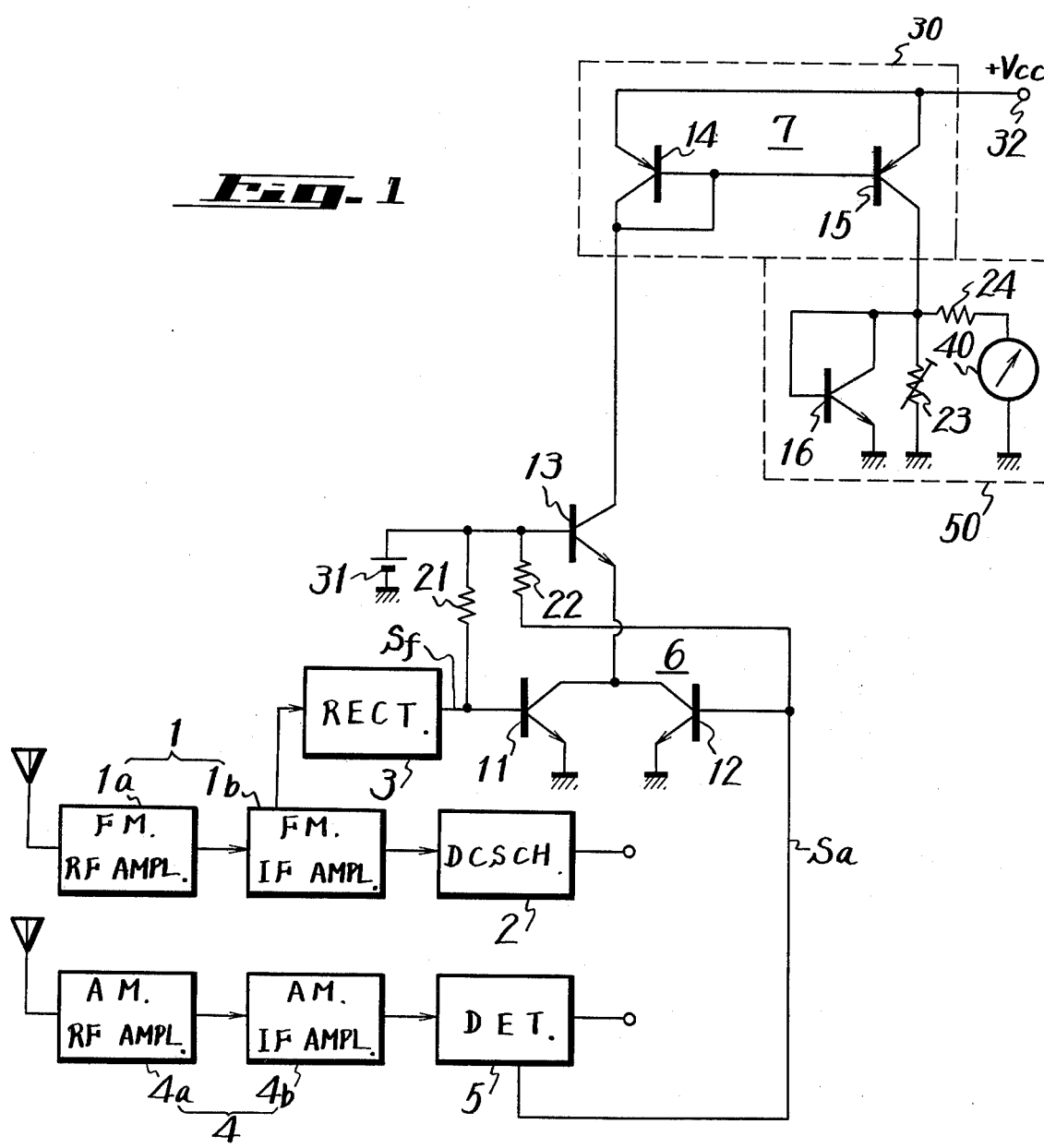
FIG. 1 is a circuit diagram showing a first embodiment of the input level display circuit for a receiver according to the invention.

FIGS. 1 and 2 show only the parts of an AM/FM receiver which are necessary for describing the invention. The other parts, for example, a voltage supply circuit, an audio amplifier stage and etc. of the receiver are omitted or not shown since they are not necessary for explaining the invention, but it is possible that well known circuit construction can be used for the omitted parts.

In FIG. 1, which shows a first embodiment of the invention, an FM broadcasting signal as a first signal is received by a well known antenna and then supplied to a first input circuit 1. The first input circuit 1 includes the FM high frequency (RF) signal amplifier 1a and an FM intermediate frequency (IF) signal amplifier 1b. The output signal from the IF signal amplifier 1b is supplied to a well known FM demodulator or discriminator 2 which produces an audio signal.

An AM broadcasting signal as a second signal is received by an antenna and then supplied to a second input circuit 4 which includes an AM high frequency (RF) signal amplifier 4a and an AM intermediate frequency (IF) signal amplifier 4b. The output signal from the IF signal amplifier 4b is supplied to a well known detector circuit 5 which demodulates the signal and produces an audio signal.

The IF amplifier 1b of the FM input circuit 1 is connected further to a rectifier circuit 3 which then produces a first direct current signal $S_f$ having a level in response to the level of a signal supplied to the FM input circuit 1. Similarly, the IF amplifier 4b of the AM input circuit 4 is connected to the detector circuit 5, so that the detector circuit 5 produces a second direct current signal $S_a$ having a level in response to the level of a signal supplied to the AM input circuit 4. The first and second direct current signals $S_f$ and $S_a$ are respectively supplied to the base electrodes of transistors 11 and 12 whose collector electrodes ae connected together to form a combining amplifier circuit 6 with a transistor 13. In this case, the emitter electrodes of the transistors 11 and 12 are grounded; their collector electrodes, which are connected together as described above, are connected to the emitter electrode of the transistor 13; the base electrodes of the transistors 11 and 12 are connected through bias resistors 21 and 22, which apply shallow bias to the former, to a bias voltage source 31. The base electrode of the transistor 13 is connected to the bias voltage source 31.

The output signal obtained at the collector electrode of the transistor 13 is supplied to a meter drive circuit 30 which will drive an indicator circuit or input meter 40 for indicating the input level. The drive circuit 30 includes a current source circuit 7 which is formed of a pair of transistors 14 and 15 having the same characteristics. The base and collector electrodes of the transistor 14 are connected together and also the base electrode of the transistor 15. The emitter electrodes of both the transistors 14 and 15 are connected together to a DC voltage source 32 of $+V_{CC}$. The collector electrode of the transistor 14 is connected to the collector electrode of the transistor 13, while the collector electrode of the other transistor 15 is grounded through a resistor 23. If the transistors 14 and 15 have their base and emitter electrodes connected together, respectively, and they have the same characteristics (which can be realized by forming them on a single semiconductor body), the same voltage across the base-emitter electrodes of the transistor 14 can be supplied across the base-emitter electrodes of the transistor 15. Accordingly, through the collector electrode of the transistor 15 there flows a current substantially equal in magnitude to that through the collector electrode of the transistor 14. Thus, it will be understood that the current having the relation of 1 : 1 to that flowing through the transistor 14 flows through the transistor 15.

Further, a resistor 24 is connected in parallel to the resistor 23 and the input meter 40 is connected in series to the resistor 24. Also, a transistor 16 which is connected as a diode is connected parallel to the resistor 23. Thus, a meter circuit 50 is formed of the resistors 23, 24, the diode 16 and the input meter 40.

When the above constructed receiver is in a state for receiving an FM broadcasting signal, the direct current signal $S_f$ whose level is in response to the input level of the FM broadcasting signal, is supplied to the base electrode of the transistor 11. Therefore, a collector current, the level of which is in response to the level of the direct current signal $S_f$ flows to the collector electrode of the transistor 11 from the emitter electrode of the transistor 13. The collector current of the transistor 11 is also the emitter current of the transistor 13, so that the former is also the collector current of the transistor 14. In this case, however, since the transistors 14 and 15 are selected equal in characteristics and supplied with the equal base bias, the collector current of the transistor 15 becomes equal to that of the transistor 14. As a result, the level of the collector current of the transistor 15 results from the level of the direct current signal $S_f$. A part of the collector current of the transistor 15 flows through the resistor 24 to the input meter 40. Thus, the input level of the received FM broadcasting signal can be indicated by the input meter 40.

Meantime, when an AM broadcasting signal is received by the same receiver, the direct current signal $S_a$, whose level is in response to that of the received AM broadcasting signal, is supplied to the base electrode of the transistor 12. Therefore, the input level of the received AM broadcasting signal is indicated by the input meter 40 in a manner similar to that described just above.

As described above, with the present invention, when the FM broadcasting signal is received, its input level can be displayed by the input meter 40, while when the AM broadcasting signal is received, its input level can be also displayed by the same input meter 40. In this case, with the invention there is no need to switch the meter 40 by a switch, so that there is no fear that the reliability is deteriorated due to the switch.

Further with the invention, in addition to the fact that no switch is required, the circuit can be easily made as an integrated circuit, and when the receiver is made as an integrated circuit, the practicalities of integrated circuits can be used.

In this case, it may be considered that the input meter 40 is connected between the collector electrode of the transistor 13 and the voltage source 32. However, if such a connection is employed, the input meter 40 is connected to the voltage source 32, namely to the hot side of the voltage source line. Accordingly, if the input meter 40 or transistor 13 is erroneously short-circuited upon adjustment of the input meter 40 in sensitivity or the like, they are damaged. However, in the invention the input meter 40 is connected directly to the ground line, so that even if such an error occurs, no trouble is caused.

Further, with the invention the output impedance viewed from the collector electrode of the transistor 15 is high, and hence the collector current thereof can become a constant current. Therefore, the current flowing from the collector electrode of the transistor 15 to the resistor 23 can be changed by varying the resistance value thereof, and accordingly the sensitivity of the input meter 40 can be adjusted. In this case, since the resistor 23 is grounded, even if it is adjusted erroneously, no trouble is caused thereby.

When the input level of the AM broadcasting signal is high and exceeds the control range of the AGC upon reception of the AM broadcasting signal, the level of the direct current signal $S_a$ exceeds a set value and accordingly the collector current of the transistor 15 also exceeds a set value to damage the input meter 40. However, with the invention, the transistor 16, which has diode characteristics, serves as a limiter to limit the level of the signal supplied to the input meter 40, so that the input meter 40 is not damaged even when the received broadcasting AM signal is high in level.

Due to a similar reason, the input meter 40 is not damaged when the voltage source is connected. Also, the input meter 40 is not damaged when both FM and AM signals are at the same dial position such that both the direct current signals $S_f$ and $S_a$ are produced instantaneously upon changing from FM to AM.

FIG. 2 shows a second embodiment of the invention in which the parts producing the first and second direct current signals $S_f$ and $S_a$ with the levels in response to the input levels of the first and second input signals are the same as those shown in FIG. 1, so that they are shown with the same reference numerals and their description will be omitted.

With the example of FIG. 2, the direct current signal $S_a$ with a level in response to the level of the input signal to an AM broadcasting signal tuner from the detector circuit 5 is supplied to the base electrode of a transistor 111. The transistor 111 forms a differential amplifier 106 together with a transistor 112 in the second example. The emitter electrodes of the transistors 111 and 112 are connected through resistors 121 and 122 together to a constant current source 131, and the transistor 112 has its base electrode connected to a bias source 132 and its collector electrode connected to a voltage source terminal 133 of $+V_{CC}$. The output signal obtained at the collector electrode of the transistor 111 is supplied to a meter drive circuit 130. A part of the FM intermediate frequency signal from the IF amplifier 1b of the FM input circuit 1 is supplied to the rectifier 3 which then produces the direct current signal $S_f$ whose level is responsive to the input level of the signal to the FM tuner. The direct current signal $S_f$ is supplied through a transistor 115 to the meter drive circuit 130. That is, the direct current signal $S_f$ from the rectifier 3 is supplied to the base electrode of the transistor 115 whose emitter electrode is grounded and then through its collector electrode to the meter drive circuit 130.

The meter drive circuit 130 is formed of first and second current source circuits 107 and 108 and a combination circuit 109 which combines both the current source circuits 107 and 108. The first current source circuit 107 consists of transistors 113 and 114 whose base and emitter electrodes are connected together, and whose base electrodes connected together are connected to the collector electrode of the transistor 113. The collector electrode of the transistor 113 is connected to the collector electrode of the transistor 111. Meantime, the second current source circuit 108 consists similarly of transistors 116 and 117 whose emitter and base electrodes are connected together and whose base electrodes connected together are connected to the collector electrode of the transistor 116. The collector electrode of the transistor 116 is in turn connected to the collector electrode of the transistor 115. The combination circuit 109 is formed of the transistors 114 and 117 whose collector electrodes are connected together to a meter circuit 150. This meter circuit 150 is formed of a semi-fixed resistor 123 which is connected between the ground and the output terminal of the combination circuit 109 or the collector electrodes of the transistors 114 and 117, a resistor 124 connected in parallel to the semi-fixed resistor 123, a meter 140 connected in series thereto and a transistor 118 which is connected as a diode.

In this case, the transistors 113 and 114 which form the first current source circuit 107 and those 116 and 117 which form the second current source circuit 108 are formed, respectively, to have the same electrical characteristics at each pair. Thus, as described in detail in connection with the example of FIG. 1, the currents flowing through the collectors of the transistors 113 and 114 are equal with each other, and similarly the current flowing through the collectors of the transistors 116 and 117 are equal, by way of example. In this case, it is assumed that the FM and AM intermediate frequency signals are, respectively, obtained upon the FM and AM signal receptions only.

When the receiver shown in FIG. 2 is in a state for receiving, for example, the AM broadcasting signal, the direct current signal $S_a$ having the level responsive to the input level of the AM signal is supplied to the base electrode of the transistor 111. Therefore, the collector current, whose level is responsive to the level of the direct current signal $S_a$, flows through the collector of the transistor 111. This collector current is the collector current of the transistor 114. In this case, however, the transistors 113 and 114 are made to have the same characteristics and supplied with the same base bias, so that the collector current of the transistor 114 becomes equal to that of the transistor 113. Accordingly, the collector current of the transistor 114 has a level which is responsive to the level of the direct current signal $S_a$. A part of the collector current of the transistor 114 flows to the meter 140 through the resistor 124 and hence the input level of the received AM signal is displayed on the meter 140.

When the receiver shown in FIG. 2 is in a state for receiving the FM signal, since the direct current signal $S_f$ whose level corresponds to the input level of the received FM signal is supplied to the base electrode of the transistor 115, similarly the input level of the received FM signal is displayed on the meter 140 by the operation of the transistors 116 and 117.

As described above, with the receiver shown in FIG. 2, the input level of the received FM signal can be displayed on the meter 140 when the FM broadcasting signal is received, and the input level of the received AM signal can be displayed on the same meter 140 when the AM broadcasting signal is received.

While the circuit shown in FIG. 2 retains the advantage of the circuit shown in FIG. 1, the second circuit achieves the following additional advantage. Since the electric field intensity is different in many cases between the AM and FM broadcasting signals, it is not always preferred that the sensitivity of the input meter is selected the same for the FM and AM broadcasting signals. With the circuit of FIG. 2, however, the sensitivity of the meter 140 can be made different for the FM and AM broadcasting signals by making the characteristics of the first and second current source circuits 107 and 108 different from each other. By way of example, if the emitter areas of the transistors 113 and 114 are selected greater than those of the transistors 116 and 117, the sensitivity of the meter 140 during AM signal reception can be made higher than that during FM signal reception.

It will be understood that many modifications and variations could be effected by those skilled in the art without departing from the spirit or scope of the novel concepts of the present invention.

We claim as our invention:

1. An input level display circuit for receivers, comprising:
   a. first and second input circuits for receiving and amplifying first and second broadcasting signals, respectively,
   b. first and second carrier amplitude detector circuits connected to said first and second input circuits, respectively, for producing first and second direct current signals, respectively;
   c. a meter drive circuit means connected to a current supply and supplied with said first and second direct current signals for producing a third direct current signal in response to either one of said first and second direct current signal; and
   d. an indicating means connected to a reference potential supplied with said third direct current signal for indicating the input level of either the first input circuit or the second input circuit, said indicating means being separated from said current supply by said meter drive circuit means.

2. An input level display circuit for receivers comprising:
   a. first and second input circuits for receiving and amplifying first and second broadcasting signals, respectively,
   b. first and second rectifying circuits connected to said first and second input circuits, respectively, for producing first and second direct current signals, respectively;
   c. a meter drive circuit supplied with said first and second direct current signals and producing a third direct current signal in response to either one of said first and second direction current signals;
   d. an indicating means supplied with said third direct current signal and indicating the input level of either the first input circuit or the second input circuit;

e. said meter drive circuit being formed of first and second transistors having emitter electrodes connected together and having base electrodes also connected together, both the base electrodes being connected to the collector electrodes of the first transistor, the collector electrode of said first transistor being connected to said first and second rectifying circuits, and the collector electrode of said second transistor being connected to said indicating means.

3. An input level display circuit for receivers as claimed in claim 2, wherein the collector electrode of said first transistor is connected through a combining circuit to said first and second rectifying circuits.

4. An input level display circuit for receivers as claimed in claim 3, wherein said combining circuit comprises a pair of transistors having base electrodes supplied with said first and second direct current signals, respectively, and having collector electrodes connected together and to said drive circuit.

5. An input level display circuit for receivers as claimed in claim 2, wherein said indicating means includes a resistor connected to the collector electrode of said second transistor, a meter connected in parallel to said resistor and a diode connected in parallel to said resistor.

6. An input level display circuit for receivers, comprising:
   a. first and second input circuits for receiving and amplifying first and second broadcasting signals, respectively,
   b. first and second rectifying circuits connected to said first and second input circuits, respectively, for producing first and second direct current signals, respectively;
   c. a meter drive circuit supplied with said first and second direct current signals and producing a third direct current signal in response to either one of said first and second direct current signals;
   d. an indicating means supplied with said third direct current signal and indicating the input level of either the first input circuit or the second input circuit; and
   e. said drive circuit including first and second current source circuits formed as a combining circuit, each of said first and second current source circuits comprising first and second transistors having emitter electrodes connected in common and having base electrodes connected together, the base electrodes of said first and second transistors of each of said first and second current source circuits being connected to the collector electrode of one of said first and second transistors, the collector electrode of the first transistor of said first current source circuit being connected to said first rectifying circuit, the collector electrode of the first transistor of said second current source circuit being connected to said second rectifying circuit, and the collector electrodes of said first and second current source second transistors being connected together and to said indicating means.

7. An input level display circuit for receivers as claimed in claim 6, wherein said indicating means includes a resistor connected to the collector electrodes of said second transistors of said first and second current source circuits, a meter connected in parallel to said resistor and a diode connected in parallel to said resistor.

8. An input level display circuit for receivers comprising:
   a. first and second input circuits for receiving an amplifying first and second signals, respectively;
   b. first and second carrier amplitude detector means connected to said first and second input circuits respectively for producing first and second carrier level signals;
   c. a combining and current source means connected to a current supply for producing a third signal in response to either one of said first and second carrier level signals; and
   d. an indicating means connected to a reference potential driven by the third signal of said combining and current source means for indicating the carrier level of either of said first carrier level signals, said indicating means being separated from said current supply by said combining and current source means.

9. The input level display circuit of claim 8 in which said receiver is an AM/FM receiver, said first detector is an AM detector, and said second detector is a rectifier in addition to an FM discriminator in said receiver.

10. The input level display circuit of claim 8 in which said combining and current source means comprises a current source circuit connected to a combining amplifier circuit.

11. The input level display circuit of claim 10 in which said combining amplifier circuit comprises two transistors, one having its base connected to said second detector and the other having its base connected to said first detector, the collectors and emitters of said two transistors being commonly connected.

12. The input level display circuit of claim 8 in which said combining and current source means comprises first and second current sources having a common output connected to said indicating means, control inputs of said first and second current sources being respectively supplied with said first and second carrier level signals.

* * * * *